United States Patent
Wong et al.

(10) Patent No.: US 10,622,214 B2
(45) Date of Patent: Apr. 14, 2020

(54) TUNGSTEN DEFLUORINATION BY HIGH PRESSURE TREATMENT

(71) Applicant: Applied Materials, Inc., Santa Clara, CA (US)

(72) Inventors: Keith Tatseun Wong, Los Gatos, CA (US); Thomas Jongwan Kwon, Dublin, CA (US); Sean Kang, San Ramon, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/605,769

(22) Filed: May 25, 2017

(65) Prior Publication Data

US 2018/0342396 A1 Nov. 29, 2018

(51) Int. Cl.
| | |
|---|---|
| *H01L 21/285* | (2006.01) |
| *C23C 16/14* | (2006.01) |
| *C23C 16/08* | (2006.01) |
| *C23C 16/56* | (2006.01) |
| *H01L 21/768* | (2006.01) |
| *H01L 27/115* | (2017.01) |
| *H01L 27/11551* | (2017.01) |
| *H01L 27/11578* | (2017.01) |

(52) U.S. Cl.
CPC ........ *H01L 21/28556* (2013.01); *C23C 16/08* (2013.01); *C23C 16/14* (2013.01); *C23C 16/56* (2013.01); *H01L 21/28568* (2013.01); *H01L 21/76883* (2013.01); *H01L 27/115* (2013.01); *H01L 27/11551* (2013.01); *H01L 27/11578* (2013.01)

(58) Field of Classification Search
CPC ......... H01L 21/28556; H01L 21/28568; C23C 16/08; C23C 16/56
See application file for complete search history.

(56) References Cited

U.S. PATENT DOCUMENTS

| | | | |
|---|---|---|---|
| 4,524,587 A | 6/1985 | Kantor | |
| 5,050,540 A | 9/1991 | Lindberg | |
| 5,114,513 A | 5/1992 | Hosokawa et al. | |

(Continued)

FOREIGN PATENT DOCUMENTS

| | | |
|---|---|---|
| CN | 101871043 A | 10/2010 |
| CN | 104047676 A | 9/2014 |

(Continued)

OTHER PUBLICATIONS

Anderson, "Developing Atomic Layer Deposition Techniques of Tungsten on Carbon Nanotube Microstructures," Brigham Young University, Apr. 2014, 33 pages.

(Continued)

*Primary Examiner* — Jay C Chang
*Assistant Examiner* — Mikka Liu
(74) *Attorney, Agent, or Firm* — Patterson + Sheridan LLP

(57) ABSTRACT

Methods and systems relating to processes for treating a tungsten film on a workpiece including supporting the workpiece in a chamber, introducing hydrogen gas into the chamber and establishing a pressure of at least 5 atmospheres, and exposing the tungsten film on the workpiece to the hydrogen gas while the pressure in the chamber is at least 5 atmospheres.

20 Claims, 4 Drawing Sheets

(56) References Cited

U.S. PATENT DOCUMENTS

| | | |
|---|---|---|
| 5,149,378 A | 9/1992 | Ohmi et al. |
| 5,175,123 A | 12/1992 | Vasquez et al. |
| 5,319,212 A | 6/1994 | Tokoro |
| 5,366,905 A | 11/1994 | Mukai |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Liang et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0148631 A1 | 8/2003 | Kuo et al. |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268029 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1* | 2/2015 | Wu .................. H01L 21/28556 |
| | | 438/669 |
| 2015/0056819 A1 | 2/2015 | Wong et al. |
| 2015/0091009 A1 | 4/2015 | Yamazaki et al. |

(56) References Cited

U.S. PATENT DOCUMENTS

| | | |
|---|---|---|
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1* | 4/2016 | Zhao ............... H01L 21/3003 257/66 |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0351401 A1 | 12/2016 | Ba et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0261480 A1 | 9/2018 | Liang et al. |
| 2018/0350563 A1 | 12/2018 | Manna et al. |
| 2019/0259625 A1 | 8/2019 | Nemani et al. |

FOREIGN PATENT DOCUMENTS

| | | |
|---|---|---|
| CN | 104089491 A | 10/2014 |
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

International Search Report and Written Opinion dated Aug. 24, 2018 for Application No. PCT/US2018/034284.

International Search Report, Application No. PCT/US2018/028258 dated Aug. 9, 2018.

International Search Report and Written Opinion for PCT/US2018/035210 dated Aug. 24, 2018.

International Search Report and Written Opinion for PCT/US2018/037539 dated Oct. 5, 2018.

International Search Report and Written Opinion for PCT/US2018/038822 dated Oct. 26, 2018.

International Search Report and Written Opinion from PCT/US2018/034036 dated Aug. 24, 2018.

Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.

Shimoyama, Takehiro et al., "Porous Aluminum for Heat Exchanger", Hitachi Chemical, pp. 19-20.

Kato, T. et al., "Heat Transfer Characteristics of a Plate-Fin Type Supercritical/Liquid Helium Heat Exchanger", ICEC 14 Proceedings Supplement, 1992, pp. 260-263.

Lee, Ho-Saeng et al., "The cooling heat transfer characteristics of the supercritical CO2 in mico-fin tube", Springer, Oct. 2, 2012, pp. 173-184.

International Search Report and Written Opinion dated Nov. 30, 2018 for Application No. PCT/US2018/041688.

International Search Report and Written Opinion for PCT/US2018/043160 dated Jan. 31, 2019.

International Search Report and Written Opinion for PCT/US2018/059643 dated Feb. 26, 2019.

International Search Report and Written Opinion from PCT/US2019/012161 dated Apr. 30, 2019.

International Search Report and Written Opinion for PCT/US2019/014759 dated May 14, 2019.

International Search Report and Written Opinion for PCT/US2019/015332 dated May 15, 2019.

International Search Report and Written Opinion for PCT/US2018/059676 dated May 23, 2019.

International Search Report and Written Opinion for PCT/US2019/023431 dated Jul. 5, 2019.

Haskel Pressure on Demand, Pneumatic and Hydraulic Driven Gas Boosters, Apr. 30, 2016, 36 pp.

Taiwan Office Action dated Jul. 3, 2019 for Application No. 107136181.

Office Action for Japanese Application No. 2018-546484 dated Oct. 8, 2019.

International Search Report and Written Opinion for International Application No. PCT/US2019/040195 dated Oct. 25, 2019.

Taiwan Office Action dated Nov. 19, 2019 for Application No. 108103415.

Office Action for Japanese Application No. 2018-517285 dated Oct. 23, 2019.

Office Action for Taiwan Patent Application No. 108111501 dated Nov. 14, 2019.

International Search Report and Written Opinion for International Application No. PCT/US2019/029602 dated Aug. 14, 2019.

Taiwan Office Action dated Jun. 11, 2019 for Application No. 107138905.

\* cited by examiner

TUNGSTEN DEFLUORINATION BY HIGH PRESSURE TREATMENT

TECHNICAL FIELD

This invention concerns high pressure treatment of a tungsten film on a workpiece, such as a semiconductor wafer.

BACKGROUND

Micro-electronic circuits and other micro-scale devices are generally manufactured by the sequential deposition and patterning of multiple layers on a substrate or wafer, such as a silicon or other semiconductor material wafer. For some applications, a metal film, e.g., tungsten, is deposited on the substrate to form micro-electronic or other micro-scale components or to provide electrical interconnects.

For some layers, to achieve desired material properties, the substrate is typically put through an annealing process in which the substrate is quickly heated, usually to about 200-500° C. and more typically to about 300-400° C. The substrate may be held at these temperatures for a relatively short time, e.g., 60-300 seconds. The substrate is then rapidly cooled, with the entire process usually taking only a few minutes. Annealing may be used to change the material properties of the layers on the substrate. Annealing may also be used to activate dopants, drive dopants between films on the substrate, change film-to-film or film-to-substrate interfaces, densify deposited films, or to repair damage from ion implantation.

As feature sizes for microelectronic devices and interconnects become smaller, the allowable defect rate decreases substantially. Some defects result from contaminants embedded in one or more of the layers.

SUMMARY

In one aspect, treating a tungsten film on a workpiece includes supporting the workpiece in a chamber, introducing a hydrogen gas into the chamber, establishing a pressure of at least 5 atmospheres in the chamber, and exposing the tungsten film on the workpiece to the hydrogen gas while the pressure in the chamber is at least 5 atmospheres.

Other embodiments of this aspect include corresponding systems, apparatus, and computer programs, configured to perform the actions of the methods, encoded on computer storage devices.

These and other embodiments can each optionally include one or more of the following features.

A temperature of the tungsten film may be raised to between 250-600° C. The temperature of the tungsten film may be raised by maintaining a support for the workpiece in the chamber at an elevated temperature. The temperature of the tungsten film may be raised before establishing the pressure in the chamber of at least 5 atmospheres.

Establishing the pressure in the chamber may include introducing the hydrogen gas and an inert gas to provide a gas mixture in the chamber. The hydrogen gas in the gas mixture in the chamber may be between 1-4% by volume percent of the gas mixture. The inert gas in the gas mixture in the chamber may include nitrogen and/or argon. The tungsten film may be exposed to the hydrogen gas while the hydrogen gas has a partial pressure of 1-10 bar.

The tungsten film may be a portion of a fabricated three-dimensional NAND (3D NAND) structure.

In another aspect, a method of forming tungsten on a workpiece includes depositing a tungsten film on the workpiece by chemical vapor deposition using a precursor gas containing tungsten and fluorine, and exposing the tungsten film on the workpiece to a hydrogen gas in a chamber while a pressure in the chamber is at least 5 atmospheres.

The tungsten film may be a portion of a three-dimensional NAND (3D NAND) in fabrication. The precursor gas may include tungsten hexafluoride. The tungsten film is raised to a temperature between 250-600° C. The chamber pressure may be established by introducing the hydrogen gas and an inert gas (e.g., argon and/or nitrogen) to provide a gas mixture in the chamber.

In another aspect, an annealing system includes a chamber body that defines a chamber, a support to hold a workpiece with an outer surface of the workpiece exposed to an environment in the chamber, a robot to insert the workpiece into the chamber, a first gas supply to provide a hydrogen gas, a pressure source coupled to the chamber to raise a pressure in the chamber to at least 5 atmospheres, and a controller coupled to the robot, the first gas supply, and the pressure source. The controller is configured to cause the robot to transport the workpiece having a tungsten film on it into the chamber, cause the gas supply to supply the hydrogen gas to the chamber, and cause the pressure source to raise a pressure in the chamber to at least 5 atmospheres while the workpiece is held on the support in the chamber.

The annealing system may include a heater to raise a temperature of the workpiece on the support to between 250-600° C. The heater may include a resistive heater embedded in the support, and/or the heater may be a radiative heater in a wall of the chamber body that is positioned to irradiate the workpiece on the support. The pressure source may include a pump.

The annealing system may include a second gas supply to supply an inert gas (e.g., argon and/or nitrogen) to the chamber, and the controller may be coupled to the second gas supply and may be configured to cause the first gas supply to introduce the hydrogen gas and the second gas supply to introduce the inert gas to provide a gas mixture in the chamber.

Particular embodiments of the subject matter described in this specification can be implemented so as to realize one or more of the following advantages. Post-deposition annealing of tungsten films can improve film quality by reducing the presence of fluorine in the tungsten films. Reducing fluorine can reduce the likelihood of defects and can increase yield. The use of high pressure gas for defluorination allows for lower temperatures during the anneal by improving the diffusion of the gas into the layers, maintaining a relatively low thermal budget for the post-processing of the workpiece and preserving overall layer structure quality. Additionally, lower temperatures for deposition may be used for depositing the tungsten films, thereby reducing layer intermixing resulting from higher temperature depositions.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Introduction

In general, it is desirable to reduce defect densities of layers deposited on a workpiece, e.g., a deposited tungsten film on a semiconductor wafer, e.g., a semiconductor wafer being used for fabrication of a 3D NAND structure. Defect densities may arise in a variety of manners including residue from a precursor gas (e.g., tungsten hexafluoride) used in the deposition process of a tungsten film. Decreasing the residual fluorine in a deposited tungsten film can reduce detrimental effects such as unintentional oxide etches causing defects in adjacent layers and decreased k-value in gate oxides deposited adjacent to the tungsten film.

Described below are systems and methods for high pressure treatment to defluorinate a tungsten film using a high pressure anneal. A tungsten film deposited on a workpiece is exposed to high pressure (e.g., at least 5 atmospheres) of forming gas (e.g., 4% hydrogen gas mixed with an inert gas) while held at elevated temperatures (e.g., 300-500° C.) for a few minutes to an hour.

System

Figure 1:
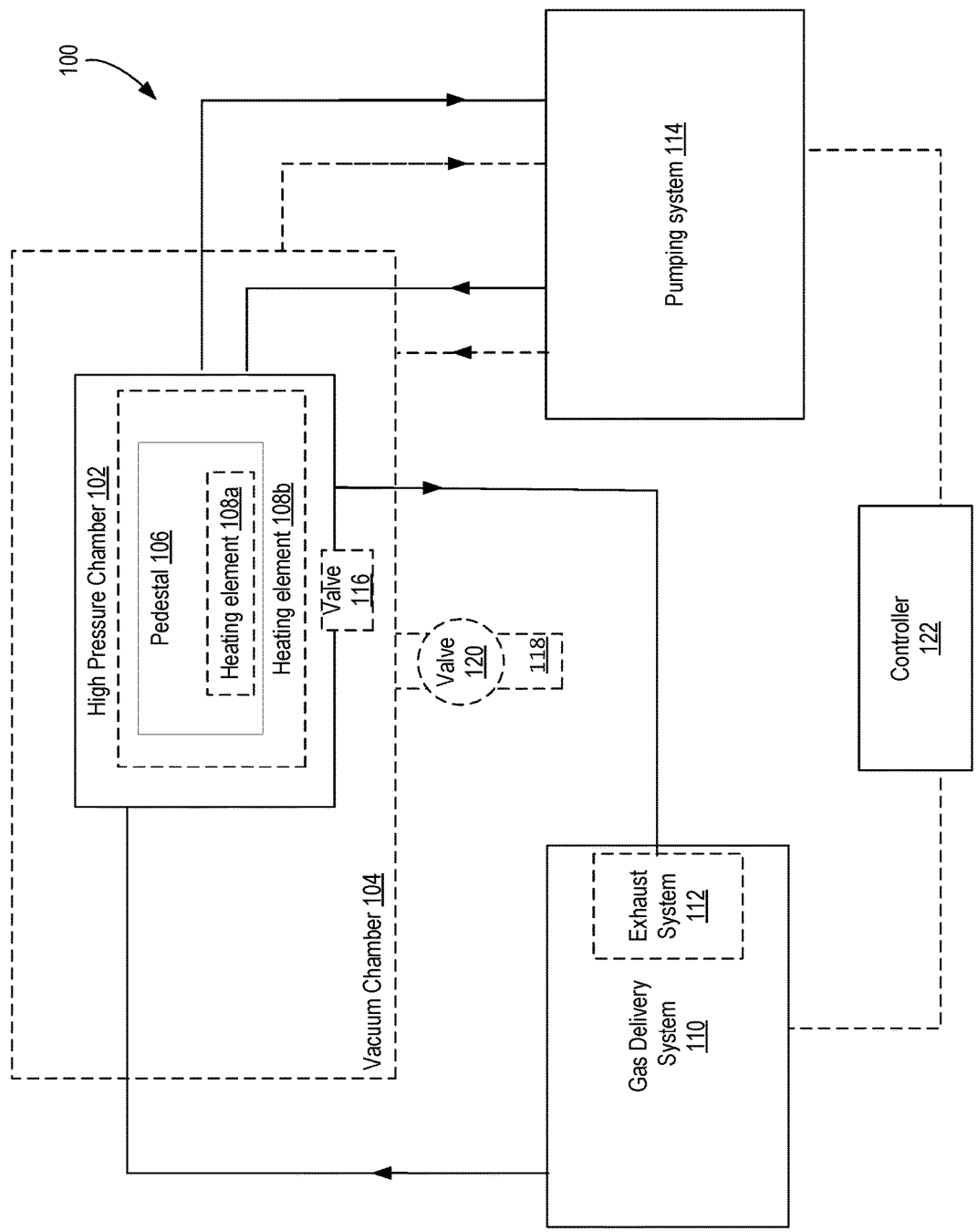
FIG. 1 is a block diagram of a high-pressure substrate processing system.

FIG. 1 is a block diagram of a high-pressure substrate processing system 100. The high-pressure substrate processing system 100 includes a high pressure chamber 102. The high pressure chamber 102 is configured to contain pressures of at least 5 atm, e.g., at least 10 atm, and can be capable of holding vacuum levels of up to 10^-3 torr. In some implementations, the high-pressure substrate processing system 100 includes a low-pressure environment 104, e.g., a vacuum chamber, for when a workpiece is being transferred between processing chambers (e.g., from another processing chamber into the high pressure chamber 102). The relative pressures within the high pressure chamber 102 and the low pressure chamber 104 can be controlled independently of each other.

A robot (not depicted in FIG. 1) including a robotic arm can be used to transfer the workpiece into and out of the high pressure chamber 102, e.g., between the chambers of a multi-chamber substrate processing tool.

The high pressure chamber 102 includes a support, for example, pedestal 106 for supporting a workpiece in the high pressure chamber 102. The pedestal 106 supports one or more workpieces using a variety of support mechanisms, for example, the pedestal 106 may support the workpiece with locking pins and springs, and/or the workpiece may rest directly on top of the pedestal 106.

In some implementations, the high pressure chamber 102 includes one or more heating elements 108. For example, heating element 108a is a resistive heater and is integrated into the pedestal 106 for heating the workpiece. In some implementations, the high pressure chamber 102 includes a heating element 108b, where the heating element 108b can heat and maintain a selected temperature within the high pressure chamber 102. Heating element 108b may be a radiative heater embedded in a wall of the high pressure chamber body, and positioned to irradiate the workpiece on the pedestal 106. The heat from the heating elements 108 can be sufficient to anneal the workpiece when the workpiece is supported on the pedestal 106 and a gas (if used) has been introduced into the high pressure chamber 102. The heating elements 108 may be resistive heating elements, and may heat the workpiece conductively and/or radiatively. Additionally, the heating elements 108 may include a discrete heating coil, or a radiative heater (e.g., an infrared lamp).

A gas delivery system 110 is operable to pressurize and depressurize the high pressure chamber 102. The gas delivery system 110 provides a gas mixture to the high pressure chamber 102 to establish a high pressure, e.g., a pressure of at least 5 atmospheres. In some implementations, the gas delivery system 110 includes an exhaust system 112 to exhaust the gas from the high pressure chamber 102 thereby depressurizing the high pressure chamber 102. The gas delivery system includes a pressure source to raise the pressure in the chamber 102 to the high pressure. The pressure source can include a pump, e.g., a rotary pump, a scroll pump, and/or a screw pump, configured to pump gas into the chamber 102 until the desired pressure is reached, and/or a compressed gas cylinder at a pressure sufficient that, after the gas cylinder is fluidically connected to the chamber 102, the equalized pressure will reach the desired pressure.

A pumping system 114 includes one or more pumps for reducing pressures in the high pressure chamber 102 and/or the vacuum chamber 104. Pumps may include a rotary pump, a scroll pump, and/or a screw pump. For example, the pumping system 114 can be used to lower the pressure in the vacuum chamber 104 to be at vacuum or near-vacuum pressure, e.g., less than 1 milliTorr. In another example, the pumping system 114 may be used during a pump and purge cycle in the high pressure chamber 102 to reduce presence of contaminants in the high pressure chamber 102 prior to process operation.

In some implementations, a valve assembly 116 isolates the relative pressures between the high pressure chamber 102 and the vacuum chamber 104. The high-pressure environment within the high pressure chamber 102 can thus be separated and sealed from the low pressure environment within the vacuum chamber 104. The valve assembly 116 is operable to enable the workpiece to be transferred directly between the high pressure chamber 102 and the vacuum chamber 104.

In some implementations, the high-pressure substrate processing system 100 includes a foreline 118 connected to the vacuum chamber 104 and connected to an outside environment. An isolation valve 120 is arranged along the foreline 118 to isolate the pressure within the vacuum chamber 104 from the pressure of the outside environment. The isolation valve 120 can be operated to adjust the pressure within the vacuum chamber 104 and to releases gases within the vacuum chamber 104. The isolation valve 120 can be operated in conjunction with the pumping system 114 to regulate the pressure within the vacuum chamber 104.

One or more operations of the high-pressure substrate processing system 100 may be controlled by one or more controllers 122. The controller 122, e.g., a general purpose programmable computer, is connected to and operable to control some or all of the various components of the high-pressure substrate processing system 100. Operations controlled by controller 122 may include, for example, temperature regulation of the heating elements 108 within the high pressure chamber 102, pressure regulation within the high pressure chamber 102, vacuum regulation within the vacuum chamber 104, flow rates and gas delivery by the gas delivery system 110, and operation of one or more pumps in the pumping system 114. For example, the controller 122 can be programmed to generate control signals that cause the components of the high-pressure substrate processing system 100 to carry out the process described below with reference to FIG. 2.

High-Pressure Treatment of a Tungsten Film

Figure 2:
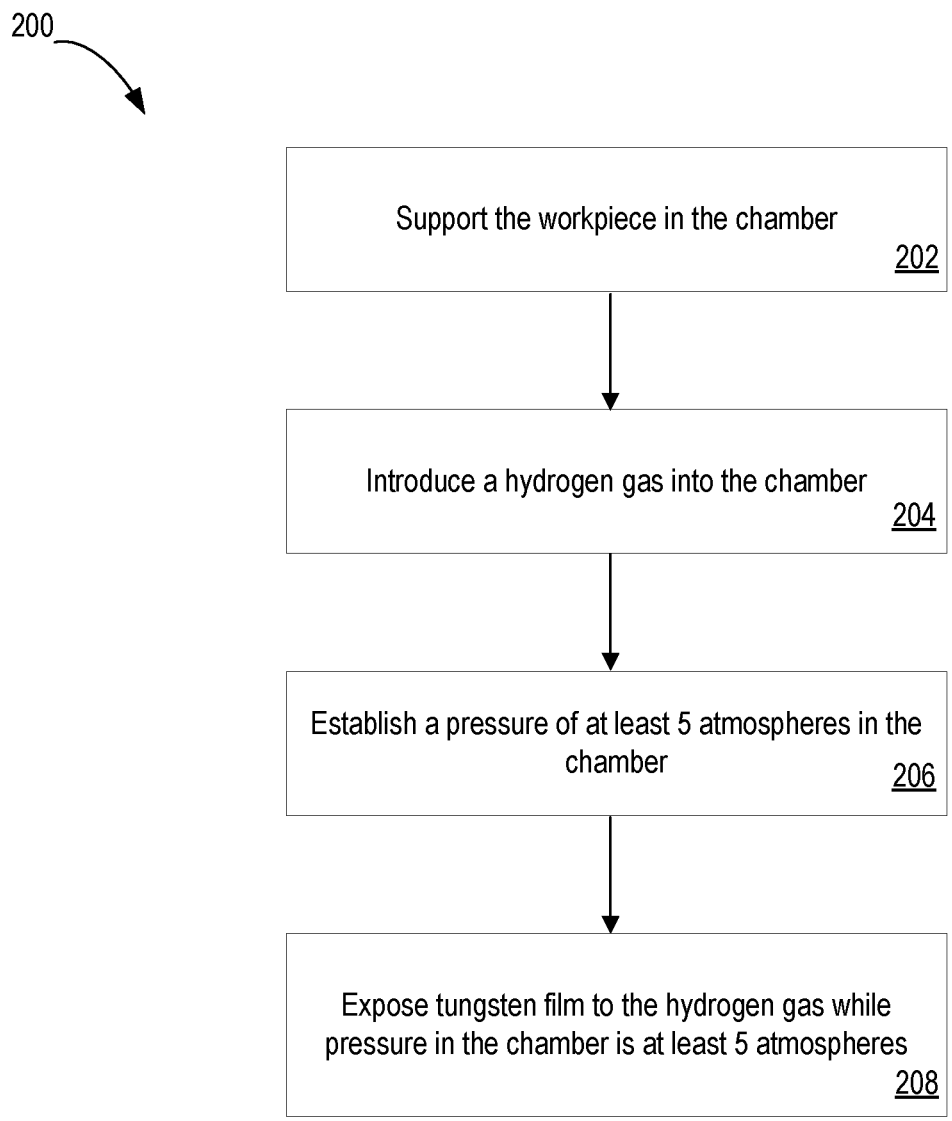
FIG. 2 is a flow diagram of an example process flow for tungsten defluorination by high pressure treatment in a high-pressure substrate processing system.

FIG. 2 is a flow diagram of an example process flow 200 for defluorination of a tungsten film on a workpiece by high pressure treatment in a high-pressure substrate processing system 100. In one example, a workpiece includes a semiconductor substrate (e.g., silicon), with a tungsten film deposited on the substrate. In some implementations, the tungsten film forms part of a 3D NAND structure fabricated on the substrate; the workpiece may also include layers of other materials (e.g., SiN, TiN). The tungsten film may be deposited on the workpiece using chemical vapor deposition (CVD) in a separate processing step. In some implementations, the tungsten film is deposited using atomic layer deposition (ALD).

The workpiece is inserted into the chamber, e.g., by the robot, and then supported in the chamber, e.g., on a pedestal 106 within the high pressure chamber 102 (202). In some implementations, the high pressure chamber 102 and/or the pedestal 106 are maintained at a particular temperature (e.g., 300-500° C.) using one or more heating elements 108. The temperature of the high pressure chamber 102 and/or the pedestal 106 may be established prior to introducing the workpiece into the high pressure chamber 102. Furthermore, the temperature of the workpiece (e.g., a tungsten film on a substrate) may be established at a particular temperature (e.g., 250-600° C.) through the use of one or more heating elements 108 while the workpiece is supported by the pedestal 106 in the high pressure chamber 102. In some implementations, the temperature of the workpiece (e.g., the tungsten film on the substrate) is raised prior to establishing the pressure in the high pressure chamber 102 of at least 5 atmospheres.

A hydrogen gas is introduced into the high pressure chamber 102 (204). The hydrogen gas can be of the form $H_2$ or deuterium gas ($D_2$). The hydrogen gas can be a portion of a forming gas that includes one or more inert gases (e.g., nitrogen and/or argon). In some implementations, the percentage of hydrogen gas in the forming gas is at least 1%, and at most 4.5%, by volume percent. The inert gas can be mixed with the hydrogen gas before being delivered into the high pressure chamber 102 by the gas delivery system 110, or the inert gas and the hydrogen gas can be delivered into the high pressure chamber 102 by separate nozzles of the gas delivery system 110, and mixed in the high pressure chamber 102.

The gas delivery system 110 can establish a total pressure (inert gas and hydrogen gas) of 5 to 50 atmospheres in the high pressure chamber 102 (206). In some implementations, the total pressure in the high pressure chamber 102 is at least 10 atmospheres. Pressure in the high pressure chamber 102 may be established as a static pressure. In some implementations, the pressure in the high pressure chamber is established by a flow of forming gas through an inlet/outlet of the gas delivery system 110 into the high pressure chamber 102. In some implementations, the tungsten film is exposed to the hydrogen gas while the hydrogen gas has a partial pressure of 1-10 bar.

After the desired pressured is established in the high pressure chamber 102, the tungsten film on the workpiece is exposed to the hydrogen gas while the high pressure chamber 102 is maintained at the elevated pressure (208). Exposure times include a few minutes to several hours (e.g., at least 5 minutes, and no more than one hour). In some implementations, the annealing temperature (e.g., temperature of the workpiece during the anneal process), hydrogen partial pressure in the high pressure chamber 102, and exposure times for the defluorination process, may be interrelated such that optimal operational parameters may be found by adjusting the aforementioned (and other) variables.

Without being limited to any particular theory, the molecular hydrogen gas cracks on the surface of the heated tungsten film into atomic hydrogen and then diffuses along the grain boundaries of the tungsten film. Diffusion of the reactants (e.g., cracked hydrogen) into the tungsten film may be a limiting factor for the rate with which the defluorination process occurs. As the cracked hydrogen diffuses into the tungsten film, the cracked hydrogen bonds with fluorine on the surface or embedded within the tungsten film. The bonded hydrogen and fluorine form hydrogen fluoride which can then diffuse out of the tungsten film. The atomic hydrogen may additionally serve to weaken and break bonds between the fluorine and tungsten in the tungsten film.

In some implementations, the hydrogen gas is introduced into the high pressure chamber 102 by the gas delivery system 110 prior to or during the heating process of the workpiece. For example, a high pressure of hydrogen gas may be introduced into the high pressure chamber 102 while heating elements 108 are bringing a workpiece on pedestal 106 to a particular desired temperature.

In some implementations, the workpiece may be heated to a particular temperature while it is in the vacuum chamber 104 and then subsequently transferred to the high pressure chamber 102 by a robot (not depicted), where the hydrogen gas may be introduced.

In some implementations, a tungsten film is deposited on a workpiece, which may then undergo the high pressure treatment described herein. For example, a tungsten film can be deposited on the workpiece by chemical vapor deposition (CVD) using a precursor gas containing tungsten and fluorine (e.g., tungsten hexafluoride). In some implementations, tungsten hexachlroride can be used as a precursor gas to deposit a tungsten film. An amount of residual fluorine trapped within the deposited tungsten film may depend, in part, on the temperature of deposition (e.g., lower deposition results in higher concentrations of residual fluorine). The tungsten film may then be exposed to a hydrogen gas in a high pressure chamber 102 while a pressure in the high pressure chamber 102 is at least 5 atmospheres.

Embodiments of High-Pressure Substrate Processing Systems

Figure 3:
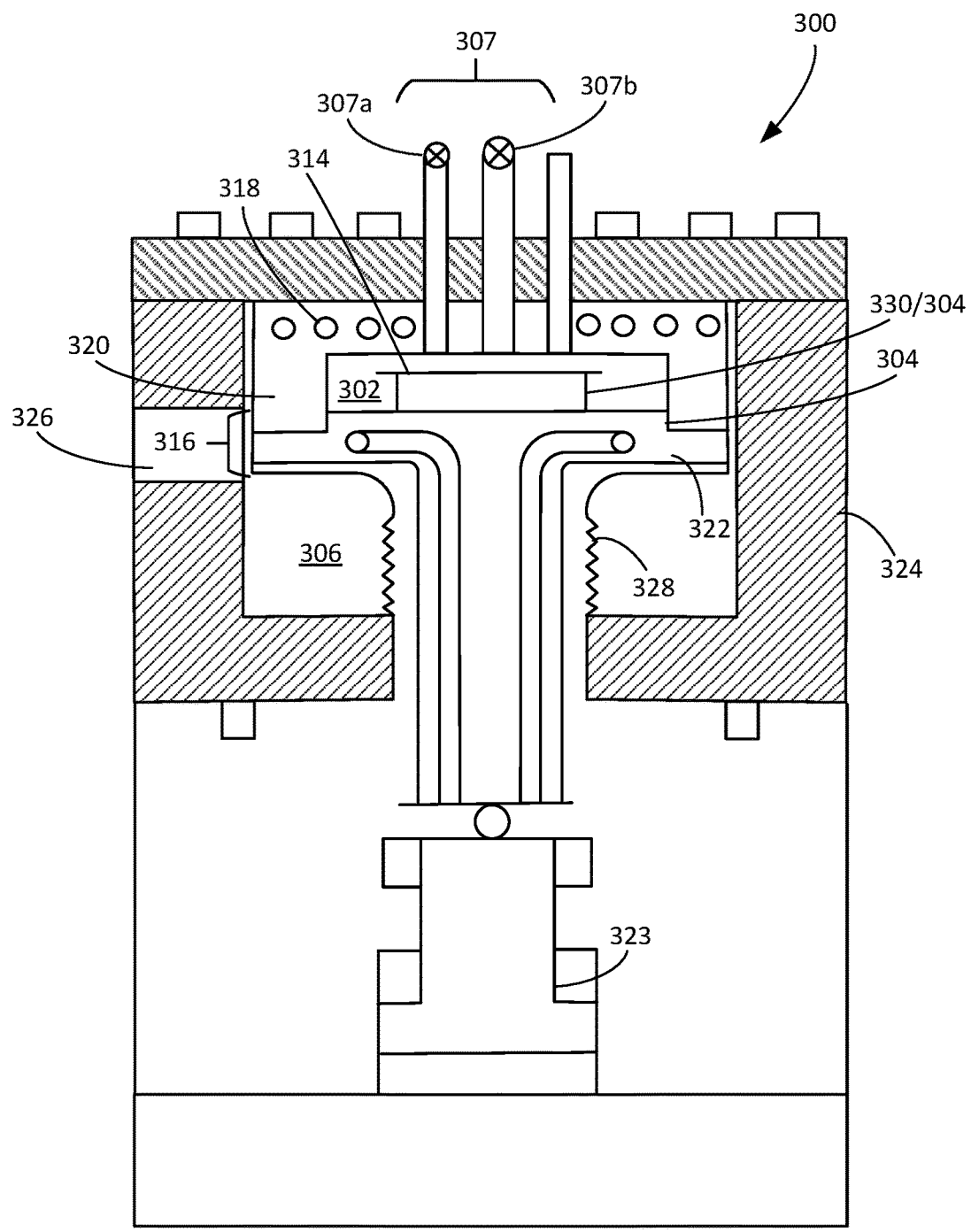
FIG. 3 depicts an example high-pressure substrate processing system.
Figure 4:
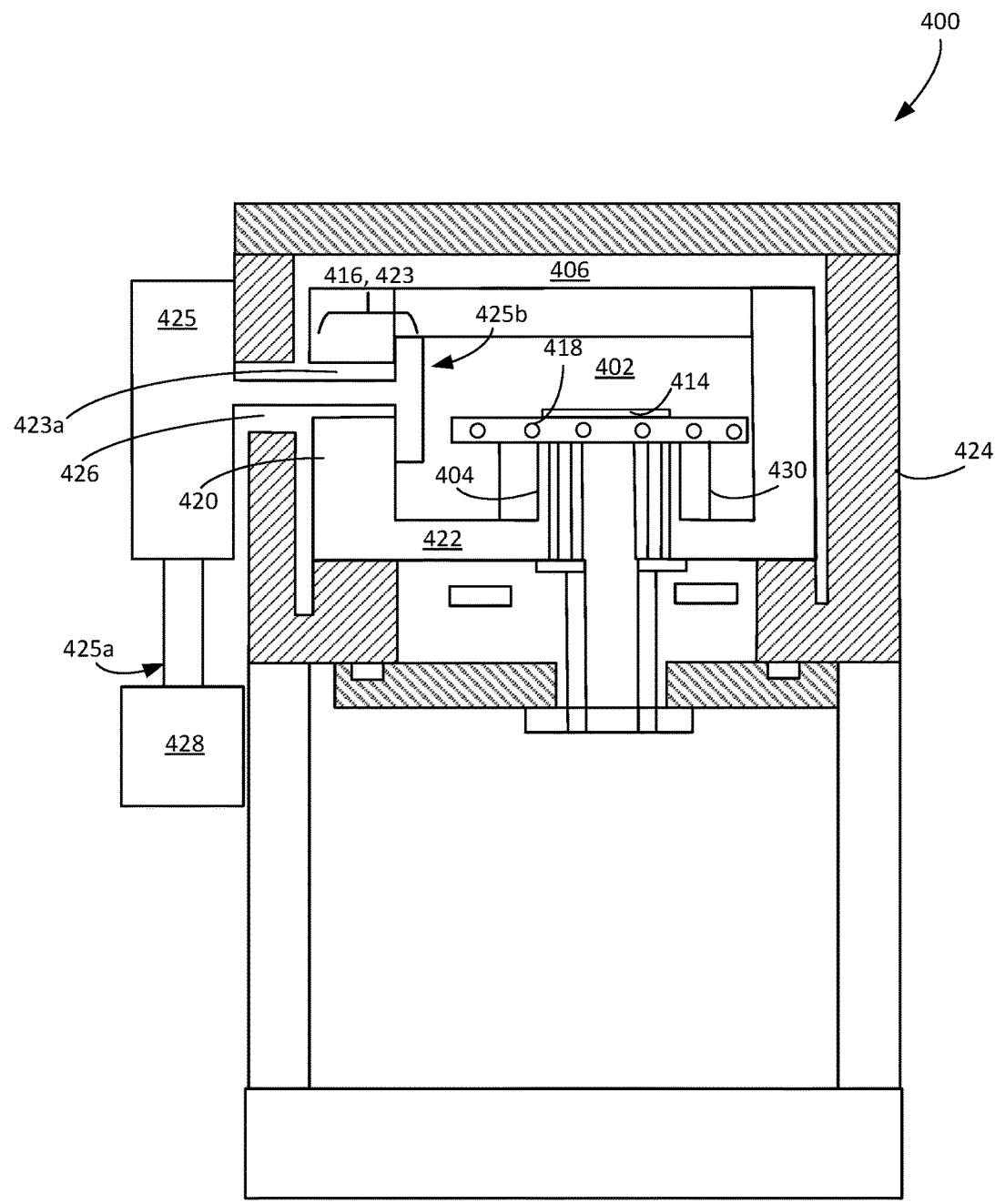
FIG. 4 depicts another example of a high-pressure substrate processing system.

FIGS. 3 and 4 depict two embodiments of high-pressure substrate processing systems. FIG. 3 depicts an example high-pressure substrate processing system 300 including a first chamber 302 (e.g., a high pressure chamber 102), a pedestal 304, a second chamber 306 (e.g., a vacuum chamber 104), and a controller (e.g., the controller 122). The high-pressure substrate processing system 300 further includes a pumping system (not shown) similar to the pumping system 114 and a gas delivery system 307 similar to the gas delivery system 110 described with respect to FIG. 1. For example, the gas delivery system 307 includes an input line 307a and an exhaust line 307b. The precursor gas is introduced into the first chamber 302 through the input line 307a, and the precursor gas is exhausted from the first chamber 302 through the exhaust line 307b.

The pedestal 304 supports a workpiece 314 on which a film of material (e.g., tungsten film) is to be defluorinated through a high pressure treatment. The pedestal 304 is positioned or positionable within the first chamber 302. In some implementations, the substrate 314 sits directly on a flat top surface of the pedestal. In some implementations, the substrate 314 sits on pins 330 that project from the pedestal.

The high-pressure substrate processing system 300 includes an inner wall 320, a base 322, and an outer wall 324. The first chamber 302 is provided by a volume within the inner wall 320, e.g., between the inner wall 320 and the base 322. The second chamber 304 is provided by a volume outside the inner wall 320, e.g., between the inner wall 320 and the outer wall 324.

The high-pressure substrate processing system 300 further includes a valve assembly 316 between the first chamber 302 and the second chamber 306 that provides the functionality of the valve assembly 116 of FIG. 1, i.e., it can be operated to isolate the first chamber 302 from the second chamber 306. For example, the valve assembly 316 includes the inner wall 320, the base 322, and an actuator 323 to move the base 322 relative to the inner wall 320. The actuator 323 can be controlled to drive the base 322 to move vertically, e.g., away from or toward the walls 320 defining the first chamber 302. A bellows 328 can be used to seal the second chamber 306 from the external atmosphere while permitting the base 322 to move vertically. The bellows 328 can extend from a bottom of the base 322 to a floor of the second chamber 306 formed by the outer wall 324.

When the valve assembly 316 is in a closed position, the base 322 contacts the walls 320 such that a seal is formed between the base 322 and the walls 320, thus separating the outer chamber 306 from the inner chamber 302. The actuator 323 is operated to drive the base 322 toward the inner walls 320 with sufficient force to form the seal. The seal inhibits air from the first high-pressure chamber 302 from being exhausted into the low-pressure second chamber 306.

When the valve assembly 316 is in an open position, the base 322 is spaced apart from the walls 320, thereby allowing air to be conducted between the first and second chambers 302, 306 and also allowing the substrate 314 to be accessed and transferred to another chamber.

Because the pedestal 304 is supported on the base 322, the pedestal 304 is thus also movable relative to the inner walls 320. The pedestal 304 can be moved to enable the substrate 314 to be more easily accessible by the transfer robot. For example, an arm of a transfer robot (not depicted) can extend through an aperture 326 in the outer wall 324. When the valve assembly 316 is in the open position, the robot arm can pass through the gap between the inner wall 320 and the base 322 to access the substrate 314.

In some implementations, the high-pressure substrate processing system 300 includes one or more heating elements 318 configured to apply heat to the substrate 314. The heat from the heating elements 318 can be sufficient to anneal the substrate 314 when the substrate 314 is supported on the pedestal 304 and the precursor gas (if used) has been introduced into the first chamber 302. The heating elements 318 may be resistive heating elements. The one or more heating elements 318 may be positioned in, e.g., embedded in, the inner walls 320 defining the first chamber 302. This heats the inner wall 320, causing radiative heat to reach the substrate 314. The substrate 314 can be held by the pedestal 304 in close proximity to the ceiling of inner wall to improve transmission of heat from the inner wall 320 to the substrate 314.

However, the one or more heating elements 318 may be arranged in other locations within the high-pressure substrate processing system 300, e.g., within the side walls rather than ceiling. An example of a heating element 318 includes a discrete heating coil. Instead of or in addition to a heater embedded in the inner walls 320, a radiative heater, e.g., an infrared lamp, can be positioned outside the first chamber 302 and direct infrared radiation through a window in the inner wall 320. Electrical wires connect an electrical source (not shown), such as a voltage source, to the heating element, and can connect the one or more heating elements 318 to the controller.

The controller is operably connected to the pumping system, the gas delivery system 307, and the valve assembly 316 for controlling operations to perform the high pressure treatment of a layer of material on the substrate 314. In some implementations, the controller may also be operably connected to other systems. For example, the controller can also be operably connected to one or more of the transfer robots (not depicted), the one or more heating elements 318, and/or the actuator 323. In some cases, the controller 122 shown in FIG. 1 includes the controller of the high-pressure substrate processing system 300.

In a process to perform a high pressure treatment of a layer of material on the substrate 314, the controller can operate the pumping system to depressurize the second chamber 306 to a low-pressure state, e.g., to a state in which the second chamber 306 has a pressure less than 1 atmosphere, to prepare for transfer of the substrate 314 through the second chamber 306. The low-pressure state can be a near-vacuum state, e.g., a pressure less than 1 milliTorr. The substrate 314 is moved through the second chamber 306 by a transfer robot (not shown), while the second chamber 306 is at the low-pressure so that contamination and oxidation of the substrate 314 can be inhibited.

The substrate 314 is transferred into the first chamber 302 for processing. To transfer the substrate 314 into the first chamber 302, the controller can operate the valve assembly 316, e.g., open the valve assembly 316 to provide an opening through which the substrate 314 can be transferred into the first chamber 302. The controller can operate the transfer robot to carry the substrate 314 into the first chamber 302 and to place the substrate 314 on the pedestal 304.

After the substrate 314 is transferred into the first chamber 302, the controller can operate the valve assembly 316 to close the opening, e.g., close the valve assembly 316, thereby isolating the first and second chambers 302, 306 from one another. With the valve assembly 316 closed, pressures in the first chamber 302 and the second chamber 306 can be set to different values. The controller can operate the gas delivery system 307 to introduce the hydrogen gas into the first chamber 302 to pressurize the first chamber 302. The introduction of the hydrogen gas can increase the pressure within the first chamber 302, for example, to 5 atmospheres or more.

The hydrogen gas and the proper temperature and pressure conditions in the first chamber 302 can cause the high pressure treatment of the material to occur, e.g., as described with reference to FIG. 2. During the high pressure treatment, the controller can operate the one or more heating elements 318 to add heat to the substrate 314 to facilitate the annealing of the layer of material on the substrate 314.

When the high pressure treatment is complete, the substrate 314 can be removed from the first chamber 302 using the transfer robot and, if necessary, the substrate 314 can be transferred to a subsequent process chamber or to the outside environment. Alternatively, the substrate 314 is transferred into a load lock chamber (not shown). To prepare for transfer of the substrate 314 out of the first chamber 302, the controller can operate the exhaust system of the gas delivery system 307 to depressurize the first chamber 302 before the valve assembly 316 is opened. In particular, before the substrate 314 is transferred out of the first chamber 202, the precursor gas is exhausted from the first chamber 302 to reduce the pressure within the first chamber 202. The pressure in the first chamber 302 can be reduced to a near-vacuum pressure such that the pressure differential between the first chamber 302 and the second chamber 306 can be minimized.

To enable the substrate 314 to be transferred out of the first chamber 302, the controller can open the valve assembly 316. The opened valve assembly 316 provides an opening through which the substrate 314 is moved to be transferred into the second chamber 306. In particular, the opened valve assembly 316 enables the substrate 314 to be transferred directly into the second chamber 306, e.g., into the low pressure environment of the second chamber 306.

FIG. 4 depicts another example of a high-pressure substrate processing system 400 including a first chamber 402 (e.g., high pressure chamber 102), a pedestal 404, a second chamber 406 (e.g., vacuum chamber 104), and a controller similar to controller 122 shown in FIG. 1. The high-pressure substrate processing system 400 is similar to the high-pressure substrate processing system 300 described with respect to FIG. 3; unless otherwise specified the various options and implementations are also applicable to this embodiment.

For example, the gas delivery system and the pumping system of the high-pressure substrate processing system 400 are operated in a similar manner to maintain the low and high pressure environments for a substrate 414 processed using the high-pressure substrate processing system 400. The second chamber 406 can be defined by volume between inner walls 420 and outer walls 424. In addition, the substrate 414 is also supportable on the pedestal 404 for processing within the first chamber 402. Again, the substrate can sit directly on the pedestal 404, or sit on lift pins 430 that extend through the pedestal.

The high-pressure substrate processing system 400 differs from the high-pressure substrate processing system 300 of FIG. 3 in a few regards. First, inner walls 420 defining the first chamber 402 are not movable relative to a base 422 defining the first chamber 402. The pedestal 404 is thus fixed relative to the inner walls 420 and the base 422. In some examples, the pedestal 404 is fixed to the base 422 defining the first chamber 402.

Rather than being arranged in the inner walls 420 of the first chamber 402, as is the case for the one or more heating elements 318 of the embodiment of FIG. 3, one or more heating elements 418 of the embodiment depicted in FIG. 4 are arranged within the pedestal 404. The substrate 414 is thus heated through contact with the pedestal 404.

The high-pressure substrate processing system 400 further includes a valve assembly 416 between the first chamber 402 and the second chamber 406 that, similar to the valve assembly 316 of FIG. 3, isolates the first chamber 402 from the second chamber 406. However, in contrast to the valve assembly 316, the valve assembly 416 is not formed by the walls 420 and the base 422 defining the first chamber 402, but rather is formed by an arm 424 movable relative to the inner walls 420 and the base 422 of the first chamber 402. The arm 424 can movable relative to the inner walls 420 and the base 422 of the first chamber 402.

In particular, the valve assembly 416 includes a slit valve 423 between the first chamber 402 and the second chamber 406. The slit valve 423 includes a slit 423a and the arm 424. The slit 423a extends through one of the inner walls 420 of the first chamber 402. A proximal end 424a of the arm 424 is positioned outside of the first chamber 402 while a distal end 424b of the arm 424 is positioned within the first chamber 402. The proximal end 425a of the arm 425 can be positioned within the second chamber 406 and be driven by an actuator positioned within the second chamber 406. Alternatively, the proximal end 425a of the arm 425 is positioned outside of the second chamber 406 and is thus driven by an actuator 428 that is also positioned outside of the second chamber 406.

The arm 425 extends through the slit 423a and is movable relative to the walls 420 so that the arm 425 can be moved to a position in which it forms a seal with the walls 420. The actuator 428 is coupled to the proximal end 425a of the arm 425 and drives the distal end 425b of the arm 425 relative to the walls 420. The arm 425 is also movable vertically to cover or uncover the slit 423a. In particular, the proximal end 425a of the arm 425 can be or include a flange that extends substantially parallel to the adjacent inner surface of the inner wall 420. The arm 425 is also movable and driven laterally so that the distal end 425b of the arm 425 can engage or disengage the inner walls 420.

The arm 425 can also extend through an aperture 426 in the outer wall 424.

Like the valve assembly 316, the valve assembly 416 is movable between an open position and a closed position. When the valve assembly 416 is in the closed position, the distal end 425b of the arm 425 covers the slit 426 and contacts one of the inner walls 420, thereby forming the seal to isolate the first chamber 402 from the second chamber 406. In particular, the distal end 425b of the arm 425, e.g., the flange, contacts an inner surface of the wall 420 defining the first chamber 402.

When the valve assembly 416 is in the open position, the distal end 425b of the arm 425 is spaced laterally apart from the inner walls 420, e.g., the inner surface of the inner walls 420. In addition, the distal end 425b of the arm 425 is positioned vertically so that the slit 426 is uncovered. The slit 426 thus provides an opening that enables fluidic communication between the first chamber 402 and the second chamber 406 and that also enables the substrate 414 to be moved in and out of the first chamber 402, e.g., by a robot as discussed above.

The controller can operate the high-pressure substrate processing system 400 in a manner similar to the process described with respect to the controller of the high-pressure substrate processing system 300 to transfer the substrate 414 into and out of the first chamber 402 and to perform the high pressure treatment on the layer of material on the substrate 414. In this process, to open and close the valve assembly 416, the controller can operate the actuator 428 to drive the arm 425.

An advantage of the configuration shown in FIG. 4 is that the pressure within the first chamber 402 helps force the distal end 425 of the arm 425 against the inner surface of the inner wall 420. Consequently, in contrast to the configuration shown in FIG. 3, the actuator can be less powerful.

The controller and other computing devices part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Accordingly, other embodiments are within the scope of the following claims.

What is claimed is:

1. A method of treating a tungsten film on a workpiece, comprising:
    supporting the workpiece in a chamber;
    introducing a hydrogen gas into the chamber;
    establishing a pressure of at least 5 atmospheres in the chamber;
    exposing the tungsten film on the workpiece to the hydrogen gas while the pressure in the chamber is at least 5 atmospheres, wherein the tungsten film comprises fluorine on a surface or embedded within the tungsten film;
    forming atomic hydrogen on the tungsten film by exposing the tungsten film to the hydrogen gas; and
    forming hydrogen fluoride from the atomic hydrogen and the fluorine.

2. The method of claim 1, comprising raising a temperature of the tungsten film to between 250-600° C.

3. The method of claim 2, wherein raising the temperature of the tungsten film comprises maintaining a support for the workpiece in the chamber at an elevated temperature.

4. The method of claim 3, wherein the temperature of the tungsten film is raised before establishing the pressure in the chamber of at least 5 atmospheres.

5. The method of claim 1, wherein establishing the pressure in the chamber comprises introducing the hydrogen gas and an inert gas to provide a gas mixture in the chamber.

6. The method of claim 5, wherein the hydrogen gas comprises at most 4.5% by volume percent of the gas mixture.

7. The method of claim 6, wherein the hydrogen gas comprises at least 1% by volume percent of the gas mixture.

8. The method of claim 5, wherein the tungsten film is exposed to the hydrogen gas while the hydrogen gas has a partial pressure of 1-10 bar.

9. The method of claim 5, wherein the inert gas comprises one or more of nitrogen or argon.

10. The method of claim 1, wherein the tungsten film is a portion of a 3D NAND in fabrication.

11. The method of claim 1, wherein the tungsten film on the workpiece is exposed to the hydrogen gas while the pressure in the chamber is at least 10 atmospheres to 50 atmospheres.

12. The method of claim 1, further comprises:
    removing the hydrogen fluoride from the tungsten film.

13. A method of forming tungsten on a workpiece, comprising:
    depositing a tungsten film on the workpiece by chemical vapor deposition using a precursor gas containing tungsten;
    exposing the tungsten film on the workpiece to a hydrogen gas in a chamber while a pressure in the chamber is at least 5 atmospheres to form atomic hydrogen on the tungsten film, wherein the tungsten film comprises fluorine on a surface or embedded within the tungsten film; and
    forming hydrogen fluoride from the atomic hydrogen and the fluorine.

14. The method of claim 13, wherein the precursor gas comprises tungsten hexafluoride.

15. The method of claim 13, comprising raising a temperature of the tungsten film to between 250-600° C.

16. The method of claim 13, comprising establishing the pressure in the chamber by introducing the hydrogen gas and an inert gas to provide a gas mixture in the chamber.

17. The method of claim 13, wherein the tungsten film is a portion of a 3D NAND in fabrication.

18. The method of claim 13, wherein the tungsten film on the workpiece is exposed to the hydrogen gas while the pressure in the chamber is at least 10 atmospheres to 50 atmospheres.

19. A method of treating a tungsten film on a workpiece, comprising:
    introducing a gas mixture comprising a hydrogen gas into a chamber containing the workpiece, wherein the gas mixture comprises at least 1% to 4.5% of the hydrogen gas based on volume percent of the gas mixture;
    establishing a pressure of at least 5 atmospheres in the chamber;
    exposing the tungsten film on the workpiece to the hydrogen gas while the pressure in the chamber is at least 5 atmospheres to 50 atmospheres, wherein the tungsten film comprises fluorine on a surface or embedded within the tungsten film;
    forming atomic hydrogen on the tungsten film by exposing the tungsten film to the hydrogen gas; and
    forming hydrogen fluoride from the atomic hydrogen and the fluorine.

20. The method of claim 19, further comprises:
    removing the hydrogen fluoride from the tungsten film.

* * * * *